United States Patent
Milkov

(10) Patent No.: US 9,357,151 B1
(45) Date of Patent: May 31, 2016

(54) SHARED COUNTER CIRCUIT WITH LOW-VOLTAGE SIGNAL OUTPUT FOR A COLUMN-PARALLEL SINGLE SLOPE ADC

(71) Applicant: TELEDYNE SCIENTIFIC & IMAGING, LLC, Thousand Oaks, CA (US)

(72) Inventor: Mihail Milkov, Moorpark, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 14/671,179

(22) Filed: Mar. 27, 2015

(51) Int. Cl.
*H03M 1/56* (2006.01)
*H04N 5/378* (2011.01)
*H04N 5/369* (2011.01)
*H04N 5/3745* (2011.01)
*H04N 5/363* (2011.01)
*H03M 1/00* (2006.01)
*H04N 3/14* (2006.01)

(52) U.S. Cl.
CPC .............. *H04N 5/378* (2013.01); *H04N 5/363* (2013.01); *H04N 5/3698* (2013.01); *H04N 5/37455* (2013.01); *H03M 1/00* (2013.01); *H03M 1/56* (2013.01); *H04N 3/155* (2013.01)

(58) Field of Classification Search
CPC ........... H03M 1/56; H03M 1/00; H04N 3/155
USPC ................ 341/169, 170, 164, 157; 348/308
See application file for complete search history.

(56) References Cited

U.S. PATENT DOCUMENTS

| | | | |
|---|---|---|---|
| 7,626,532 B2 | 12/2009 | Maruyama | 341/169 |
| 8,253,617 B2 | 8/2012 | Bogaerts | 341/169 |
| 8,531,327 B2 | 9/2013 | Sohn | 341/170 |
| 8,692,582 B1 | 4/2014 | Atesoglu et al. | 327/65 |
| 2009/0195431 A1 | 8/2009 | Snoeij et al. | 341/155 |
| 2011/0121161 A1 | 5/2011 | Itzhak et al. | 250/208.1 |
| 2011/0128176 A1 | 6/2011 | vanVeldhoven | 341/155 |
| 2012/0039548 A1* | 2/2012 | Wang | H03M 1/1009 382/312 |
| 2013/0120180 A1 | 5/2013 | Kawahito | 341/172 |
| 2013/0242125 A1 | 9/2013 | Yang et al. | 348/222.1 |
| 2015/0185416 A1 | 7/2015 | Stupgar et al. | |

* cited by examiner

*Primary Examiner* — Joseph Lauture
(74) *Attorney, Agent, or Firm* — Koppel, Patrick, Heybl & Philpott

(57) ABSTRACT

A shared counter circuit for a column-parallel single-slope ADC includes an n-bit counter; n low-voltage (LV) drivers connected to receive respective counter output bits and to provide a logic high or logic low output signal which tracks the received bit, the voltage difference between the logic high and logic low output signals being less than Vdd; and a plurality of sets of regenerative latches powered by a supply voltage Vdd, each of which receives an output from a respective LV driver and latches and regenerates the received output as a rail-to-rail CMOS signal upon the occurrence of a trigger event. One typical trigger event occurs when a periodic ramp voltage exceeds an input voltage provided to the ADC which may originate, for example, from the columns of a photodetector array.

20 Claims, 4 Drawing Sheets

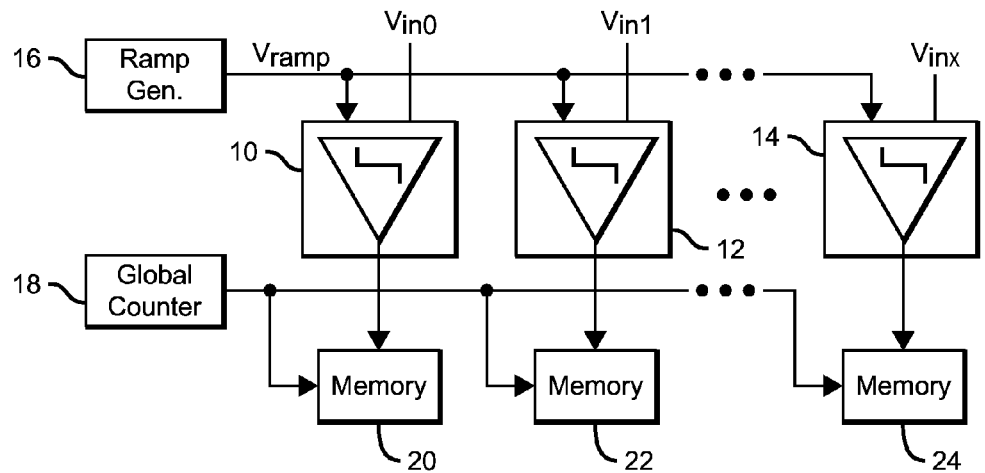
*FIG. 1*
PRIOR ART
*FIG. 2a*
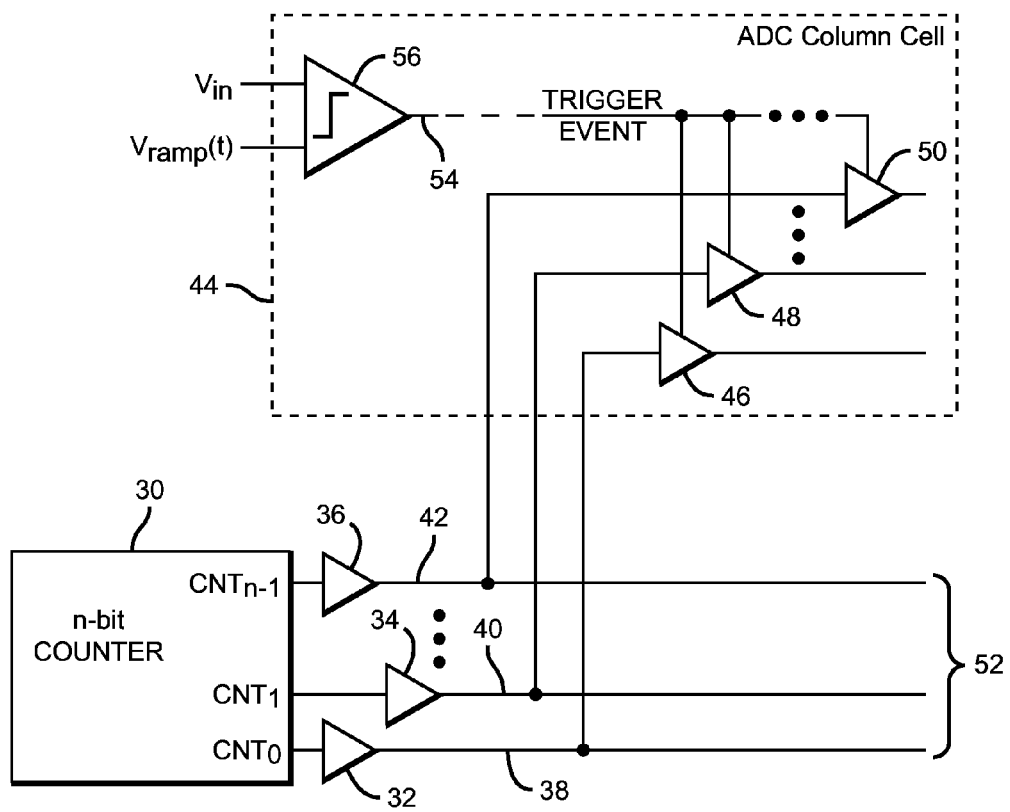

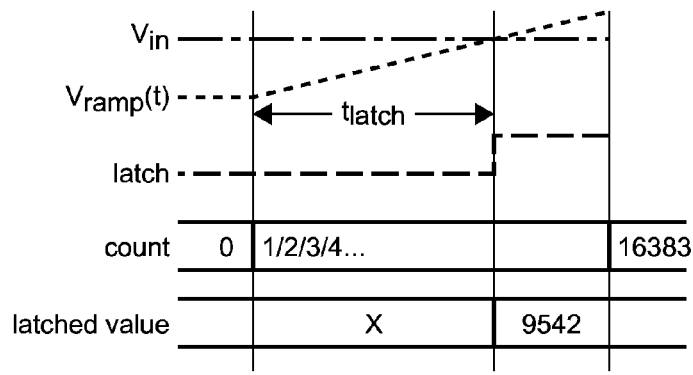
FIG. 2b
FIG. 4a
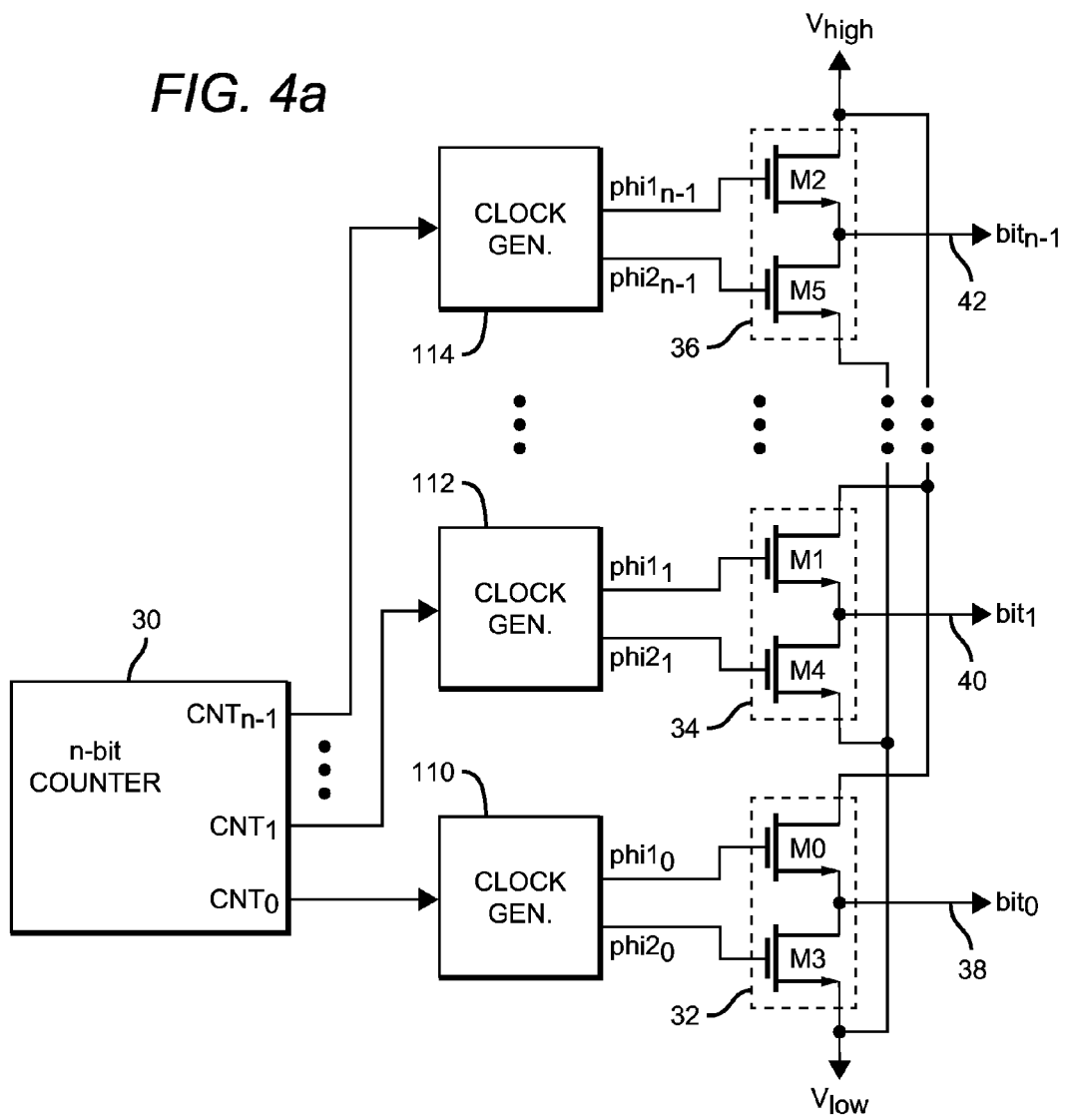

US 9,357,151 B1

SHARED COUNTER CIRCUIT WITH LOW-VOLTAGE SIGNAL OUTPUT FOR A COLUMN-PARALLEL SINGLE SLOPE ADC

GOVERNMENT LICENSE RIGHTS

This invention was made with Government support under Contract FA8650-07-C-5414 awarded by the Air Force Research Laboratory at Wright Patterson Air Force Base. The Government has certain rights in the invention.

BACKGROUND OF THE INVENTION

1. Field of the Invention

This invention relates generally to column-parallel single-slope analog-to-digital converters (ADCs), and more particularly to counter circuits used with such ADCs.

2. Description of the Related Art

Image sensors generally include an array of pixels arranged in rows and columns. One common approach to reading out the voltages produced by the pixels in each column is to use a column-parallel single-slope ADC. Such an ADC requires a ramp generator which generates a periodic voltage ramp signal and a comparator which toggles its output when the ramp voltage exceeds the column voltage being measured. A counter tracks the time that elapses between the start of the ramp and the comparator output toggling; this counter value, which is a digital representation of the column voltage, is latched and provided as the ADC's output.

A counter may be located in each column of a column-parallel single-slope ADC, or a single counter may be shared among multiple columns. An example of the latter case is shown in FIG. 1. A voltage from each column, $V_{in0}$, $V_{in1}$, ..., $V_{inx}$ is provided to an input of respective comparators 10, 12, 14, each of which also receives a shared (or 'global') voltage ramp $V_{ramp}$ produced by a ramp generator 16. During each ADC conversion cycle, $V_{ramp}$ increases linearly and covers the full input signal range. The output of each comparator toggles when $V_{ramp}$ exceeds its column voltage. The system includes a shared counter 18, and the columns include respective memory locations 20, 22, 24; when the output of each column's comparator toggles, the current counter value is stored in the column's memory location and is a digital representation of the column voltage.

One of the design challenges for column-parallel single-slope ADCs is to combine high resolution and fast conversion rate; achieving this requires high-speed counter operation. If there is one counter per column, then the capacitive load on the counter output bits is relatively small and thus high-speed operation is possible, but the power dissipation and substrate noise generated in each ADC column are significant. However, if a shared counter is used as shown in FIG. 1, then the capacitive load on the counter output bits is relatively large and thus its speed (or the number of ADC columns its output can be fed to) is limited.

SUMMARY OF THE INVENTION

A shared counter circuit for a column-parallel single-slope ADC is presented which addresses the problems noted above. The counter outputs a low-voltage (LV) signal to multiple ADC columns, thereby allowing fast counting while substantially reducing power dissipation and substrate noise.

The present shared counter circuit is used with a plurality of sets of regenerative latches which latch the current counter value upon the occurrence of respective trigger events. The shared counter circuit includes:

an n-bit counter which provides n output bits representing the current counter value;

n LV driver circuits, each of which is connected to receive a respective counter output bit and to provide a logic high or logic low output signal which tracks the received bit, the voltage difference between the logic high and logic low output signals being less than a supply voltage Vdd; and a plurality of sets of regenerative latches, each of which comprises n regenerative latches powered by supply voltage Vdd, wherein each regenerative latch receives an output signal from a respective one of the LV driver circuits and is arranged to latch and regenerate the received output signal as a rail-to-rail CMOS signal upon the occurrence of a trigger event.

The LV driver circuits can be single-ended or differential. Each driver type preferably comprises switches connected between desired logic high and logic low voltage levels and an output node or nodes, with the switches operated with clock signals generated by a clock generator. The clock generator is preferably 'non-overlapping', so as to prevent the logic high and logic low voltage levels from short-circuiting via the switches. The voltage difference between the logic high and logic low output signals may be, for example, approximately 0.35 volts, with Vdd being approximately 1.8 volts.

A column-parallel single-slope ADC comprises a plurality of column cells, each of which includes a set of regenerative latches and a comparator which detects the occurrence of the trigger events. The output of each cell's comparator is coupled to its set of regenerative latches such that the latches are latched upon the occurrence of one of the trigger events. One typical trigger event occurs when a periodic ramp voltage exceeds an input voltage. Input voltages to the ADC may originate, for example, from the columns of a photodetector array.

Each of the column cells may further comprise a second set of latches to which the value latched by the regenerative latches is transferred, such that the current counter value can be read out from the second set of latches while the set of regenerative latches is latching a new current counter value.

These and other features, aspects, and advantages of the present invention will become better understood with reference to the following drawings, description, and claims.

BRIEF DESCRIPTION OF THE DRAWINGS

FIG. 1 is a block diagram of a known column-parallel single-slope ADC.

FIG. 2a is a schematic diagram of a shared counter circuit which uses single-ended LV driver circuits, in accordance with the present invention.

FIG. 2b is a timing diagram illustrating the operation of an ADC column cell.

FIG. 4a is a schematic diagram of an n-bit counter and n single-ended LV drivers as might be used in a shared counter circuit in accordance with the present invention.

DETAILED DESCRIPTION OF THE INVENTION

Figure 3:
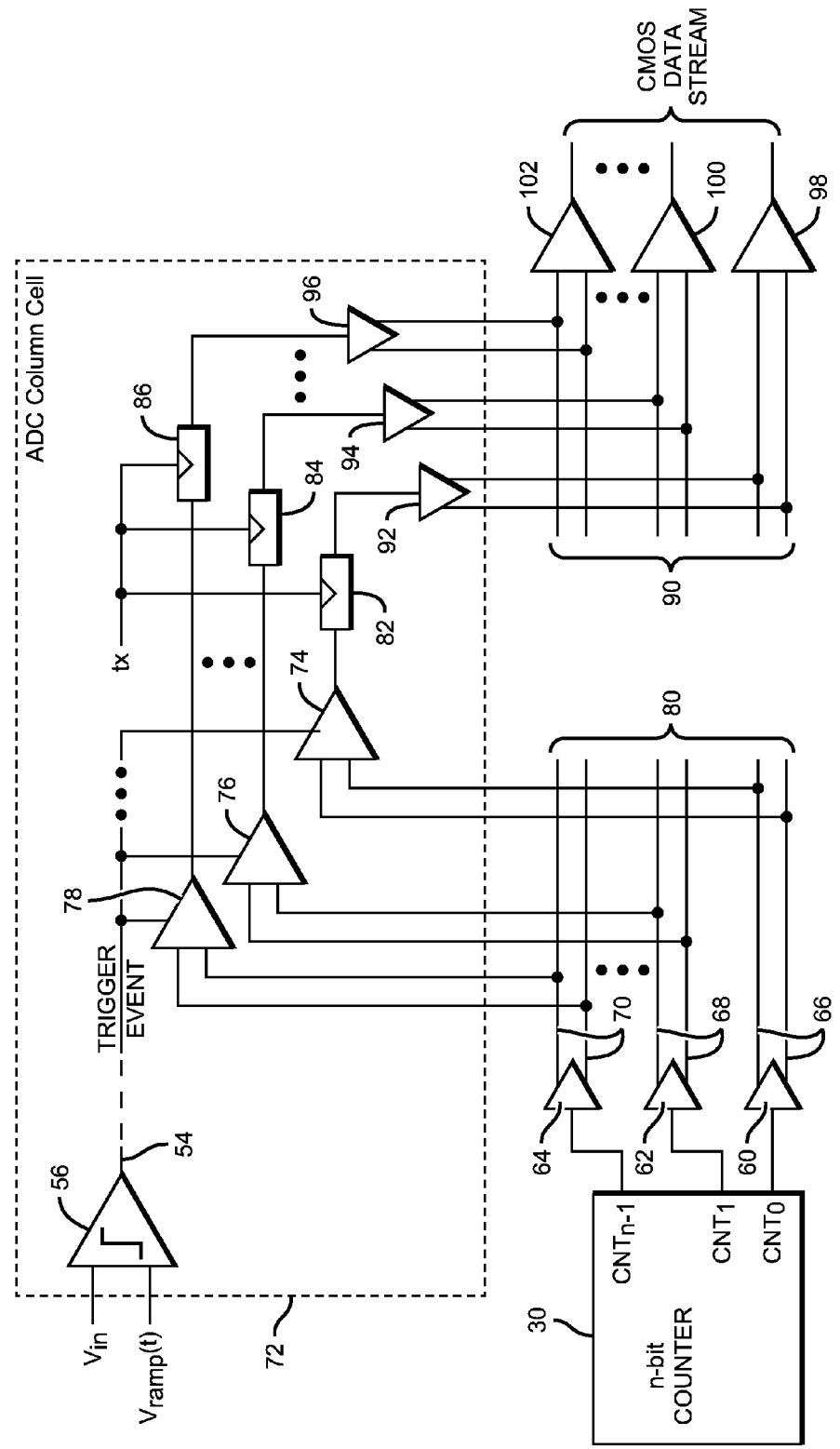
FIG. 3 is a schematic diagram of a shared counter circuit which uses differential LV driver circuits, in accordance with the present invention.

The basic principles of a shared counter circuit with LV driver circuits suitable for use with a column-parallel single-slope ADC are illustrated in the schematic diagram shown in FIG. 2a. An n-bit counter 30 produces n CMOS output bits $CNT_0, CNT_1, \ldots, CNT_{n-1}$ that represent the current counter value; as used herein, 'CMOS' refers to Vdd-referred signals—i.e., signals that span the full digital supply voltage. Each output bit is coupled to a respective LV driver circuit 32, 34, 36, each of which provides a logic high or logic low output signal 38, 40, 42 which tracks the received bit. The LV driver circuits are 'low-voltage' in that the voltage difference between the logic high output signal and the logic low output signal is less than a supply voltage Vdd—i.e., the primary digital supply voltage for the ADC and associated components.

A column-parallel single-slope ADC is made up of a plurality of column cells; one column cell 44 is shown in FIG. 2a. Each column cell has n regenerative latches which receive output signals 38, 40 and 42 via an n-bit LV counter bus 52. The regenerative latches, typically powered by supply voltage Vdd, are arranged to latch and regenerate their received output signals as rail-to-rail CMOS signals upon the occurrence of a 'trigger event'.

One possible trigger event is the toggling of the output 54 of a comparator 56 within each column cell, which occurs when a periodic ramp voltage $V_{ramp}(t)$ exceeds an input voltage $V_{in}$. Input voltages to the ADC may originate, for example, from the columns of a photodetector array. The operation of the shared counter and column cell circuitry is illustrated in FIG. 2b, wherein a 14-bit counter counting from 0 to 16383 (decimal equivalent) is assumed. Counter 30 begins counting as $V_{ramp}(t)$ begins to increase. When $V_{ramp}(t)$ exceeds $V_{in}$, at time $t_{latch}$, the output 54 ('latch') of comparator 56 toggles, causing regenerative latches 46, 48, 50 to latch the current counter value. In this way, counter 30 keeps track of the time since the start of $V_{ramp}(t)$, with time $t_{latch}$—as represented by the latched counter value—being a digital representation of $V_{in}$.

The conversion speed of single-slope ADCs is typically limited by the counter speed. Using LV drivers (32, 34, 36) in this way allows for faster counting because at high counting speeds LV output signals are easier to generate and distribute to multiple ADC columns than rail-to-rail CMOS signals. This enables the design of high resolution and/or high-speed column parallel single-slope ADCs. In addition, conveying the counter outputs as LV signals substantially reduces power consumption and reduces the switching activity and substrate noise in each column. This is helped by the fact that the regenerative latches (46, 48, 50) regenerate the LV counter bit signals to rail-to-rail CMOS levels (e.g., Vdd and ground) only once in each ADC conversion cycle. Unlike a counter per column implementation, there is no digital switching activity occurring on every count. Regenerative latches, which may be implemented by any of a number of methods well-known to those familiar with latch circuits, are advantageous in the present shared counter circuit in that they continuously track the LV counter bit signal while drawing no current from the digital supply Vdd and having no switching activity apart from the once-per-conversion-cycle regeneration event when the comparator output 54 ('latch') toggles.

The outputs of the LV drivers can be single-ended or differential; single-ended outputs (38, 40, 42) are shown in FIG. 2a. An embodiment which employs n LV drivers 60, 62, 64 having LV differential outputs 66, 68, 70—i.e., LVDS drivers—is shown in FIG. 3. Here, an ADC column cell 72 includes a set of n regenerative latches 74, 76, 78, which receive differential output signals 66, 68 and 70 via an n-bit LVDS counter bus 80. Using differential LV counter bit signals instead of single-ended LV signals improves the system's common-mode, supply and ground noise immunity.

As further illustrated in FIG. 3, each ADC column cell may further comprise a second set of latches 82, 84, 86, suitably D-latches, coupled to the outputs of regenerative latches 74, 76, 78, respectively. The first and second sets of latches are arranged such that the current counter value is transferred to latches 82, 84, 86 after it has been latched by regenerative latches 74, 76, 78. The transfer occurs in response to a timing signal tx provided to each latch, which would typically be pulsed as soon as counting is complete (by which point each regenerative latch has latched a counter value). In this way, the latched counter values (corresponding to the ADC outputs) from the previous conversion cycle can be read out from second set of latches 82, 84, 86 while regenerative latches 74, 76, 78 are tracking and latching new counter values.

An ADC incorporating the present shared counter circuit can further include an n-bit shared LV data read bus 90 which conveys the outputs from each column cell's second set of latches 82, 84, 86; data from each column would preferably be read out sequentially to the shared LV data read bus. A second set of LV drivers 92, 94, 96 can be connected to receive the output of a respective one of the second set of latches, and to provide a logic high or logic low output signal which tracks the received output. As with LVDS drivers 60, 62, 64, drivers 92, 94, 96 preferably provide LV outputs signals, with the voltage difference between the second set of drivers' logic high output signal and logic low output signal being less than Vdd. It is convenient from a chip architecture perspective if the 'high' and 'low' voltage levels used by the second set of LV drivers 92, 94, 96 are the same levels as used by the first set of LVDS drivers 60, 62, 64. Shared LV data read bus 90 and drivers 92, 94, 96 are shown as differential (LVDS) in FIG. 3, though these could also be single-ended. The ADC might also include n LV receivers 98, 100, 102, each of which receives a low-voltage output signal and converts it back to a rail-to-rail CMOS signal; the outputs of LV receivers 98, 100, 102 provide the final CMOS output data stream from the ADC array.

As noted above, LV driver circuits such as drivers 32, 34, 36 can be single-ended or differential. One possible implementation of single-ended LV drivers is shown in FIG. 4a. Each single-ended driver comprises a first switch M0, M1, M2 connected between a logic high voltage level ($V_h$) and an output node 38, 40, 42, and a second switch M3, M4, M5 connected between a logic low voltage level ($V_l$) and output nodes 38, 40, 42. The difference between voltage levels $V_h$ and $V_l$ is less than the digital supply voltage Vdd.

First and second switches M0-M5 preferably comprise FETs as shown in FIG. 4a, though other types of switching elements might also be used, such as BJTs. For purposes of discussion, it is assumed that switches M0-M5 are FETs. The pull-up switches (M0-M2) and the pull-down switches (M3-M5) may be of the same polarity, typically NMOS (as shown), though this is not essential.

First switches M0, M1, M2 are preferably operated in response to respective first CMOS clock signals $phi1_0$, $phi1_1$, $phi1_{n-1}$ received at respective gate inputs, and second switches M3, M4, M5 are preferably operated in response to respective second CMOS clock signals $phi2_0$, $phi2_1$, $phi2_{n-1}$ received at respective gate inputs. Clock generators 110, 112, 114 provide the first and second CMOS clock signals to the gate inputs of respective LV drivers as needed to provide single-ended output signals at output nodes 38, 40, 42 which track the received CMOS counter output bits.

Each clock generator receives a respective counter output bit $CNT_0, CNT_1, \ldots, CNT_{n-1}$ at an input, and provides first and second CMOS clock signals phi1 and phi2 at respective outputs. Signals phi1 and phi2 are preferably non-overlapping, so as to prevent the logic high and logic low voltage levels from short-circuiting via each driver's first and second switches.

Figure 4B:
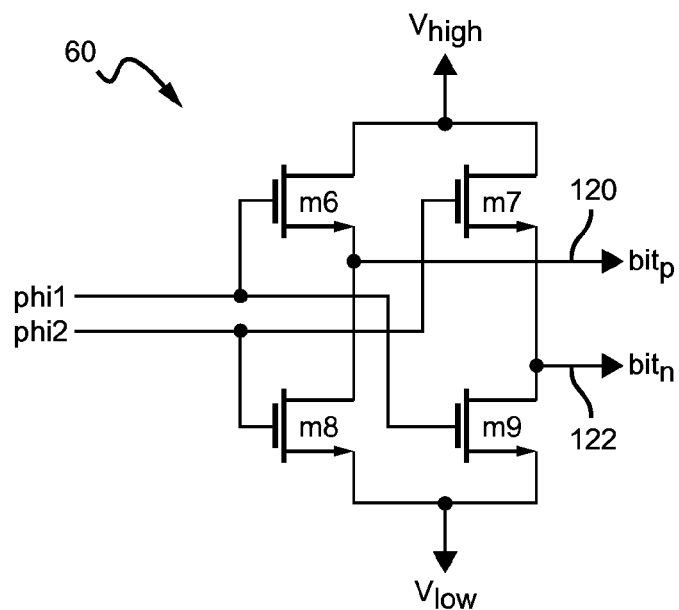
FIG. 4b is a schematic diagram of a differential LV driver as might be used in a shared counter circuit in accordance with the present invention.

One possible implementation of a low-voltage differential (LVDS) driver 60 is shown in FIG. 4b. Though only one LVDS driver is depicted in FIG. 4b, in practice, an n-bit counter would require n LVDS drivers (one per counter bit). The LVDS driver comprises first and second switches M6 and M7 connected between a logic high voltage level ($V_h$) and differential output nodes 120, 122, respectively, and third and fourth switches M8 and M9 connected between a logic low voltage level ($V_l$) and differential output nodes 120, 122, respectively. The difference between voltage levels $V_h$ and $V_l$ is less than the digital supply voltage Vdd. As above, switches M6-M9 preferably comprise FETs as shown in FIG. 4b, though other types of switching elements might also be used, such as BJTs. The pull-up switches (M6, M7) and the pull-down switches (M8, M9) may be of the same polarity, typically NMOS (as shown), though this is not essential.

First and fourth switches M6, M9 are preferably operated in response to a first clock signal phi1 received at respective gate inputs, and second and third switches M7, M8 are preferably operated in response to a second clock signal phi2 received at respective gate inputs. A clock generator (not shown) as described above, preferably non-overlapping, provides the first and second clock signals as needed to provide LVDS output signals at output nodes 120, 122 which track the CMOS counter output bit received by the clock generator.

Figure 4C:
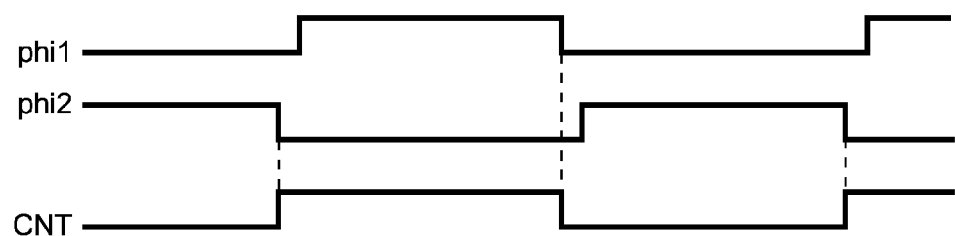
FIG. 4c is a timing diagram illustrating clock signals as might be used with an LV driver in accordance with the present invention.

An exemplary timing diagram showing non-overlapping first and second clock signals phi1 and phi2 as might be used with the LV drivers depicted in both FIGS. 4a and 4b is shown in FIG. 4c; the time at which the CNT signals from counter 30 transition are also shown. Note that the phi1 and phi2 polarity assumes that the pull-up and the pull-down switches in the LV drivers are of the same polarity, for example, both NMOS.

The LV driver circuit, whether single-ended as in FIG. 4a or differential as in FIG. 4b, switches a capacitive load (comprised of the regenerative latch capacitance of each ADC column and the routing line capacitance) at its output between voltage levels $V_h$ and $V_l$. Note that the LV driver requires no termination resistance at its output and therefore has only dynamic but not static power dissipation.

Counter 30 can be any type of counter (binary, Gray code, etc.). A Gray code counter is preferred for single-slope ADCs because an asynchronous trigger event (with respect to the counter bit transitions) leads to at most a one count error.

The voltage difference between the logic high and logic low output signals may be, for example, approximately 0.35 volts, with Vdd being approximately 1.8 volts. Thus, suitable values for voltages $V_h$ and $V_l$ are 0.35 volts and 0 volts, respectively.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A shared counter circuit for use with a plurality of sets of regenerative latches which latch a current counter value upon the occurrence of respective trigger events, comprising:
    a counter having a predetermined number of output bits representing a current counter value;
    a plurality of low-voltage (LV) driver circuits, each of which is connected to receive a respective one of said counter output bits and to provide a logic high or logic low output signal which tracks said received bit, the voltage difference between said logic high output signal and said logic low output signal being less than a supply voltage Vdd; and
    a plurality of sets of regenerative latches, each of which comprises a plurality of regenerative latches equal to the number of said counter output bits, each of said latches powered by said supply voltage Vdd,
    wherein each of said regenerative latches receives an output signal from a respective one of said driver circuits and is arranged to latch and regenerate said received output signal as a rail-to-rail CMOS signal upon the occurrence of a trigger event.

2. The shared counter circuit of claim 1, wherein each of said LV driver circuits is a single-ended driver circuit, comprising:
    a first switch connected between a logic high voltage level and an output node, said first switch operated in response to a first clock signal received at a control input on said first switch; and
    a second switch connected between a logic low voltage level and said output node, said second switch operated in response to a second clock signal received at a control input on said second switch; and
    a clock generator arranged to provide said first and second clock signals to the control inputs on said first and second switches as needed to provide a single-ended output signal at said output node which tracks said received counter output bit.

3. The shared counter circuit of claim 2, wherein said clock generator is a non-overlapping clock generator, comprising:
    an input connected to receive said counter output bit;
    a first clock output which provides said first clock signal; and
    a second clock output which provides said second clock signal;
    said non-overlapping clock generator arranged such that said first and second clock signals are non-overlapping, so as to prevent said logic high and logic low voltage levels from short-circuiting via said first and second switches.

4. The shared counter circuit of claim 2, wherein said first and second switches comprise FETs.

5. The shared counter circuit of claim 1, wherein each of said LV driver circuits is a differential driver circuit, comprising:
    a first switch connected between a logic high voltage level and a first output node, said first switch operated in response to a first clock signal received at a control input on said first switch;
    a second switch connected between said logic high voltage level and a second output node, said second switch operated in response to a second clock signal received at a control input on said second switch;
    a third switch connected between a logic low voltage level and said first output node, said third switch operated in response to said second clock signal received at a control input on said third switch; and
    a fourth switch connected between said logic low voltage level and said second output node, said fourth switch operated in response to said first clock signal received at a control input on said fourth switch; and
    a clock generator arranged to provide said first and second clock signals to the control inputs of said first, second, third and fourth switches as needed to provide a differential output signal at said first and second output nodes which tracks said received counter output bit.

6. The shared counter circuit of claim 5, wherein said clock generator is a non-overlapping clock generator, comprising:
- an input connected to receive said counter output bit;
- a first clock output which provides said first clock signal; and
- a second clock output which provides said second clock signal;
- said non-overlapping clock generator arranged such that said first and second clock signals are non-overlapping, so as to prevent said logic high and logic low voltage levels from short-circuiting via said first and third switches or via said second and fourth switches.

7. The shared counter circuit of claim 5, wherein said first, second, third and fourth switches comprise FETs.

8. The shared counter circuit of claim 1, wherein said n-bit counter is a Gray code counter.

9. The shared counter circuit of claim 1, wherein said voltage difference between said logic high output signal and said logic low output signal is approximately 0.35 volts and Vdd is approximately 1.8 volts.

10. The shared counter circuit of claim 1, wherein said shared counter circuit and said plurality of sets of regenerative latches are part of a column-parallel single-slope analog-to-digital converter (ADC).

11. The shared counter circuit of claim 10, wherein said ADC comprises a plurality of column cells, each of which includes one of said sets of regenerative latches and a comparator which detects the occurrence of said trigger events, the output of each cell's comparator coupled to its set of regenerative latches such that said set of regenerative latches is latched upon the occurrence of one of said trigger events.

12. The shared counter circuit of claim 11, wherein each of said column cells further comprises a second set of latches to which the current counter value latched by said regenerative latches is transferred after it has been latched by said regenerative latches, such that said current counter value can be read out from said second set of latches while said set of regenerative latches is latching a new current counter value.

13. The shared counter circuit of claim 11, wherein each of said comparators receives a respective input voltage and a ramp voltage, said comparator detecting the occurrence of one of said trigger events when said ramp voltage exceeds said input voltage.

14. The shared counter circuit of claim 13, wherein said input voltages originate from respective columns of a photodetector array.

15. A column-parallel single-slope analog-to-digital converter (ADC), comprising:
- a plurality of column cells which receive respective input voltages;
- a counter having a predetermined number of output bits representing a current counter value; and
- a plurality of low-voltage (LV) driver circuits, each of which is connected to receive a respective one of said counter output bits and to provide a logic high or logic low output signal which tracks said received bit, the voltage difference between said logic high output signal and said logic low output signal being less than a supply voltage Vdd;

each of said column cells comprising:
- a comparator which receives a respective input voltage and a ramp voltage and toggles its output when said ramp voltage exceeds said input voltage; and
- a plurality of regenerative latches equal to the number of said counter output bits, each of said latches powered by said supply voltage Vdd and arranged to latch when said comparator output toggles to indicate that said ramp voltage exceeds said input voltage, each of said regenerative latches receiving an output signal from a respective one of said driver circuits and is arranged to latch and regenerate said received output signal as a rail-to-rail CMOS signal when said comparator output toggles to indicate that said ramp voltage exceeds said input voltage.

16. The ADC of claim 15, wherein said input voltages originate from respective columns of a photodetector array.

17. The ADC of claim 15, wherein each of said column cells further comprises a second set of latches to which the current counter value latched by said regenerative latches is transferred after it has been latched by said regenerative latches, such that said current counter value can be read out from said second set of latches while said set of regenerative latches is latching a new current counter value.

18. The ADC of claim 17, further comprising:
- a LV counter bus which conveys the outputs of said LV driver circuits to each of said column cells; and
- a LV data read bus which conveys the outputs from each column cell's second set of latches to an output data stream.

19. The ADC of claim 17, further comprising a second set of drivers, each of which is connected to receive the output of a respective one of said second set of latches and to provide a logic high or logic low output signal which tracks said received output, the voltage difference between said second set of drivers' logic high output signal and said logic low output signal being less than Vdd.

20. The ADC of claim 15, wherein said voltage difference between said logic high output signal and said logic low output signal is approximately 0.35 volts and Vdd is approximately 1.8 volts.

\* \* \* \* \*